(12) United States Patent
Denq et al.

(10) Patent No.: US 10,310,625 B2
(45) Date of Patent: Jun. 4, 2019

(54) SHELL STRUCTURE AND MANUFACTURING METHOD THEREOF

(71) Applicants: Bar-Long Denq, Taipei (TW); Chun-Ping Li, Taipei (TW); Chih-Wen Chiang, Taipei (TW); Chien-Chu Chen, Taipei (TW)

(72) Inventors: Bar-Long Denq, Taipei (TW); Chun-Ping Li, Taipei (TW); Chih-Wen Chiang, Taipei (TW); Chien-Chu Chen, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 375 days.

(21) Appl. No.: 14/979,563

(22) Filed: Dec. 28, 2015

(65) Prior Publication Data

US 2016/0212867 A1 Jul. 21, 2016

Related U.S. Application Data

(60) Provisional application No. 62/097,021, filed on Dec. 26, 2014.

(51) Int. Cl.
*H05K 5/02* (2006.01)
*H04M 1/02* (2006.01)
(Continued)

(52) U.S. Cl.
CPC .......... *G06F 3/0202* (2013.01); *B29C 43/006* (2013.01); *H04M 1/0202* (2013.01); *H05K 5/0217* (2013.01); *H04M 1/23* (2013.01)

(58) Field of Classification Search
CPC ........... B29C 45/4311; B29C 45/14311; B29C 45/14795; B29C 45/7207; B29C 71/02; B32B 5/024; B32B 7/12; B32B 3/266; B32B 3/12; B32B 2305/188; B32B 2250/40; B32B 3/18; B32B 2250/03; B32B 2457/00; B32B 15/08; G06F 3/0202;
(Continued)

(56) References Cited

U.S. PATENT DOCUMENTS

2012/0164360 A1* 6/2012 Wu ................... B29C 45/14311
428/35.6

FOREIGN PATENT DOCUMENTS

CN 101746063 6/2010
CN 201640812 11/2010
(Continued)

OTHER PUBLICATIONS

"Office Action of Taiwan Counterpart Application", dated Feb. 8, 2017, p. 1-p. 10, in which the listed references were cited.
(Continued)

*Primary Examiner* — Camie S Thompson
(74) *Attorney, Agent, or Firm* — JCIPRNET (57) ABSTRACT

A shell structure including a casing and a frame is provided. The casing includes an elastic material structure and a fiber structure, wherein the fiber structure is intermixed with the elastic material structure, and the casing has at least two sides adjacent to each other. The frame is wrapped by the casing, wherein the casing and the frame have at least one buffering space therebetween, and the buffering space is aligned to a border between the two sides. In addition, a manufacturing method of the shell structure is also provided.

30 Claims, 7 Drawing Sheets

(51) Int. Cl.
    *B29C 43/00*     (2006.01)
    *G06F 3/02*      (2006.01)
    *H04M 1/23*      (2006.01)

(58) Field of Classification Search
    CPC .... H04M 1/0202; H04M 1/23; H05K 5/0217;
    H05K 5/0091; Y10T 428/13; Y10T
    428/1348; Y10T 428/1362; Y10T
    428/24149; B29B 13/00
    USPC ........ 428/116, 35.6, 36.1; 264/257; 156/280
    See application file for complete search history.

(56)              References Cited

FOREIGN PATENT DOCUMENTS

| CN | 102922832 |   | 2/2013  |
|----|-----------|---|---------|
| CN | 105182587 | * | 12/2015 |
| TW | 201215280 |   | 4/2012  |
| TW | 201228517 |   | 7/2012  |
| TW | 201341196 |   | 10/2013 |
| TW | 201410467 |   | 3/2014  |
| TW | I459882   |   | 11/2014 |
| TW | I483691   |   | 5/2015  |

OTHER PUBLICATIONS

"Office Action of Taiwan Counterpart Application," dated Apr. 25, 2018, p. 1-p. 4.

* cited by examiner

SHELL STRUCTURE AND MANUFACTURING METHOD THEREOF

CROSS-REFERENCE TO RELATED APPLICATION

This application claims the priority benefits of U.S. provisional application Ser. No. 62/097,021, filed on Dec. 26, 2014. The entirety of the above-mentioned patent application is hereby incorporated by reference herein and made a part of this specification.

TECHNICAL FIELD

The invention is related to a shell structure and a manufacturing method thereof, and more particularly, to a shell structure having an elastic material structure and a manufacturing method thereof.

DESCRIPTION OF RELATED ART

Advancement of semiconductor devices and display technology leads to continuous development of electronic devices towards compactness, capabilities for performing multiple functions, and portability. Common portable electronic devices include tablet PCs, smart phones and so forth.

Taking the smart phones for an example, some products having crashworthiness for a demand are mostly emphasised on using material and structural designs to prevent breakages and damages from being produced when the smart phones are dropped. Specifically, conventional crashworthiness smart phones are mostly configured with a protruding elastic material at corners of rigid casing thereof so as to provide shock absorption and protection when the smart phones are dropped. However, this type of design causes the structure at the corner region of the smart phone to be less smooth and affects an appearance thereof, and the rigid casing can still be damaged when subjected to an external force exceeding a limit bearable by the rigid casing.

Moreover, the conventional crashworthiness smart phones mostly overlap an upper cover with a lower cover at the periphery of the device body to constitute a double-layer structure to strengthen the structure of the device body; however, this approach goes against a thin and smooth design trend of the smart phones.

SUMMARY OF THE INVENTION

The invention provides a shell structure and a manufacturing method thereof, and this shell structure has a favorable crashworthiness effect and complies with a design trend of thin and smooth.

The shell structure of the invention includes a casing and a frame. The casing includes an elastic material structure and a fiber structure, wherein the fiber structure is intermixed with the elastic material structure, and the casing has at least two sides adjacent to each other. The frame is wrapped by the casing, wherein the casing and the frame have at least one buffering space therebetween, and buffering space is aligned to a border of the two sides.

In one embodiment of the invention, the fiber structure is a woven fiber layer.

In one embodiment of the invention, the elastic material structure includes an outer layer structure and an inner layer structure, and the fiber structure is wrapped between the outer layer structure and the inner layer structure.

In one embodiment of the invention, a hardness of the outer layer structure is greater than a hardness of the inner layer structure.

In one embodiment of the invention, the frame has at least one notch, and the notch is aligned to the border of the two sides.

In one embodiment of the invention, the shell structure further includes a buffer structure, wherein the buffer structure is disposed in the buffering space.

In one embodiment of the invention, the buffer structure is a porous elastic body.

In one embodiment of the invention, the buffer structure is a honeycomb structure.

In one embodiment of the invention, a thickness of the casing at the border of the two sides is smaller than a thickness of other part of the casing.

In one embodiment of the invention, the number of the at least two sides is four, and the sides are sequentially connected and include two first sides opposite to each other and two second sides opposite to each other. A distance between the two first sides is a maximum width of the shell structure, and a distance between the two second sides is a maximum length of the shell structure.

The shell structure of the invention includes a casing and a frame. The casing includes an elastic material structure, wherein the casing has at least two sides adjacent to each other. The frame is wrapped by the casing, wherein the casing and the frame have at least one buffering space therebetween, the frame has at least one notch, and the buffering space and the notch are aligned to a border of the two sides.

In one embodiment of the invention, the casing further includes a fiber structure, and the fiber structure is intermixed with the elastic material structure.

In one embodiment of the invention, the fiber structure is a woven fiber layer.

In one embodiment of the invention, the elastic material structure includes an outer layer structure and an inner layer structure, and the fiber structure is wrapped between the outer layer structure and the inner layer structure.

In one embodiment of the invention, a hardness of the outer layer structure is greater than a hardness of the inner layer structure.

In one embodiment of the invention, the shell structure further includes a buffer structure, wherein the buffer structure is disposed in the buffering space.

In one embodiment of the invention, the buffer structure is a porous elastic body.

In one embodiment of the invention, the buffer structure is a honeycomb structure.

In one embodiment of the invention, a thickness of the casing at the border of the two sides is smaller than a thickness of other part of the casing.

In one embodiment of the invention, the number of the at least two sides is four, the sides are sequentially connected and include two first sides opposite to each other and two second sides opposite to each other. A distance between the two first sides is a maximum width of the shell structure, and a distance between the two second sides is a maximum length of the shell structure.

In one embodiment of the invention, the casing has a plurality of nicks at the border of the two sides.

A manufacturing method of a shell structure of the invention includes the following steps. An elastic material structure and a fiber structure are provided, and a casing is formed with the elastic material structure and the fiber structure by performing a first hot-pressing process. A frame is provided, and the casing is combined to the frame by performing a second hot-pressing process. When performing the first hot-pressing process or the second hot-pressing process, the fiber structure is enabled to be wrapped at a periphery of the casing.

In one embodiment of the invention, the step of forming the casing with the elastic material structure and the fiber structure by performing the first hot-pressing process includes: providing an inner layer structure and a fiber structure, wherein the inner layer structure is combined to a side of the fiber structure; and providing an outer layer structure at another side of the fiber structure, and combining the outer layer structure to the another side of the fiber structure and forming the casing with the outer layer structure, the inner layer structure and the fiber structure by performing the first hot-pressing process, wherein the elastic material structure includes the outer layer structure and the inner layer structure.

In one embodiment of the invention, the step of forming the casing with the elastic material structure and the fiber structure by performing the first hot-pressing process includes: providing an outer layer structure, an inner layer structure and a fiber structure, wherein the outer layer structure and inner layer structure are respectively combined to two opposite sides of the fiber structure; and forming the casing with the outer layer structure, the inner layer structure and the fiber structure by performing the first hot-pressing process.

In one embodiment of the invention, the step of forming the casing with the elastic material structure and the fiber structure includes: performing the first hot-pressing process with a first mold.

In one embodiment of the invention, the first mold has a concave portion at the periphery of the casing, and the step of enabling the fiber structure to be wrapped at the periphery of the casing includes: enabling a portion of the elastic material structure to go into the concave portion so as to wrap the fiber structure at the periphery of the casing.

In one embodiment of the invention, the step of combining the casing to the frame includes: performing the second hot-pressing process with a second mold.

In one embodiment of the invention, t the second mold has a concave portion at the periphery of the casing, and the step of enabling the fiber structure to be wrapped by the elastic material structure at the periphery of the casing includes: providing a buffer structure, and combining the buffer structure to the frame by performing the second hot-pressing process; and enabling a portion of the buffer structure to go into the concave portion so as to wrap the fiber structure at the periphery of the casing.

In view of the above, in the shell structure of the invention, the casing is constituted of the elastic material structure and the fiber structure; and in addition to an elastic cushioning effect being provided to the casing through the elastic material structure, a tenacity is also provided to the casing through the fiber structure, so that the casing has both the characteristics of flexibility and tenacity and thus can effectively cushion and disperse an impact force when subjected to an impact. Moreover, the buffering space between the casing and the frame is aligned to the border of the two sides of the casing, and the border is, namely, a corner region of the shell structure which is most liable to be subjected to an impact when the shell structure is dropped. Thus, when the corner region is subjected to an impact, the buffering space can provide the casing with sufficient degree of elastic deformability so as to absorb the impact force. As such, the shell structure can achieve a favorable crashworthiness effect without requiring to be configured with a protruding elastic material at the corner region and without requiring to constitute a double-layer structure by overlapping casings at the periphery of the device body, and can thus comply with a design trend of thin and smooth.

In order to make the aforementioned and other features and advantages of the invention comprehensible, several exemplary embodiments accompanied with figures are described in detail below.

DESCRIPTION OF THE EMBODIMENTS

Figure 1:
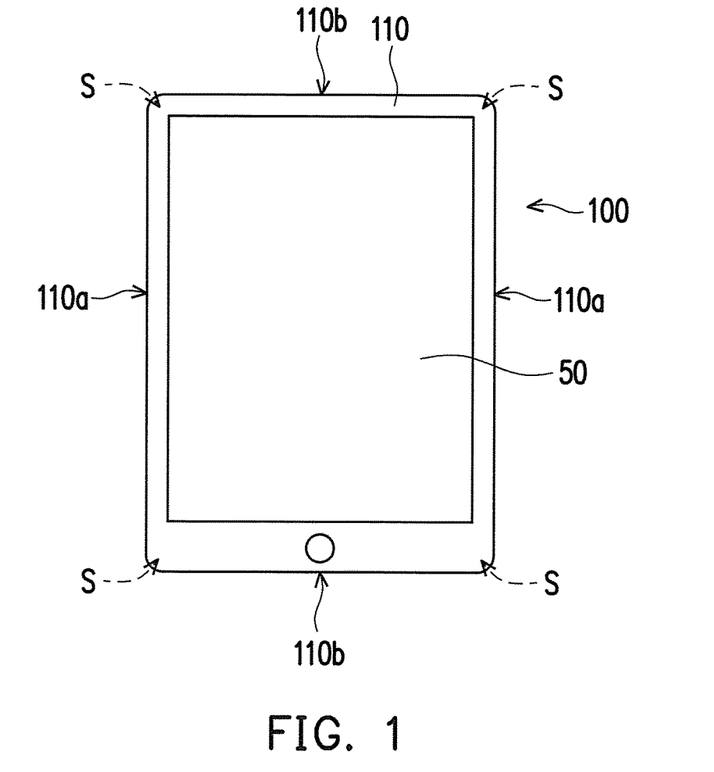
FIG. 1 illustrates a shell structure being applied to a handheld electronic device according to an embodiment of the invention.

FIG. 1 illustrates a shell structure being applied to a handheld electronic device according to an embodiment of the invention. Referring to FIG. 1, a shell structure 100 of the present embodiment is, for example, a casing of the handheld electronic device (e.g., Smart phone), and the shell structure 100 is configured to accommodate internal components (e.g., motherboard and electronic components thereon) of the handheld electronic device and expose a touch display panel 50 of the handheld electronic device for a user to view and operate.

Figure 2:
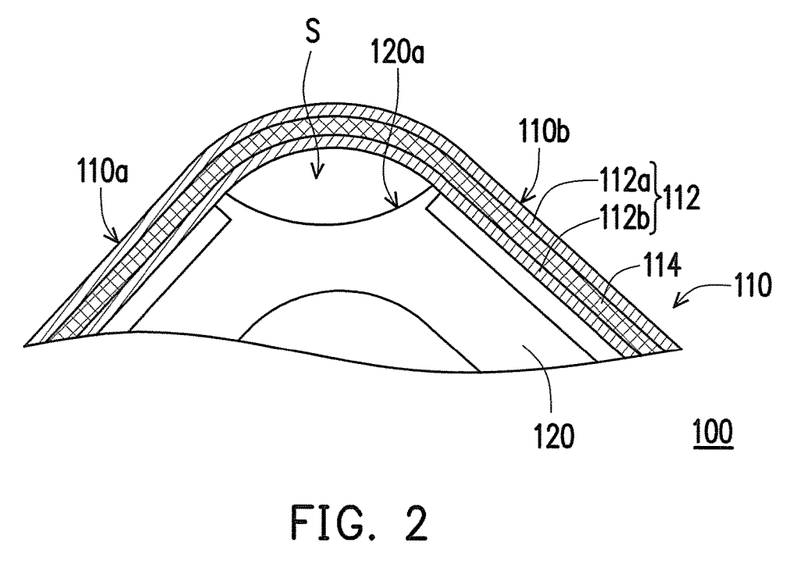
FIG. 2 is a partially enlarged diagram of the shell structure of FIG. 1.

FIG. 2 is a partially enlarged diagram of the shell structure of FIG. 1. Referring to FIG. 1 and FIG. 2, the shell structure 100 of the present embodiment includes a casing 110. The casing 110 includes an elastic material structure 112 and a fiber structure 114. The fiber structure 114 is, for example, a woven fiber layer and is intermixed with elastic material structure 112. The elastic material structure 112 includes an outer layer structure 112a and an inner layer structure 112b, and the fiber structure 114 is wrapped between the outer layer structure 112a and the inner layer structure 112b. The casing 110 has a plurality of adjunct sides (illustrated with two first sides 110a and two second sides 110b), and the two first sides 110a and the two second sides 110b are sequentially connected. The two first sides 110a are opposite to each other, and the two second sides 110b are opposite to each other. In the present embodiment, a material of the elastic material structure 112 is, for example, silicone rubber or other suitable elastic material, in which the invention is not limited thereto.

Figure 3:
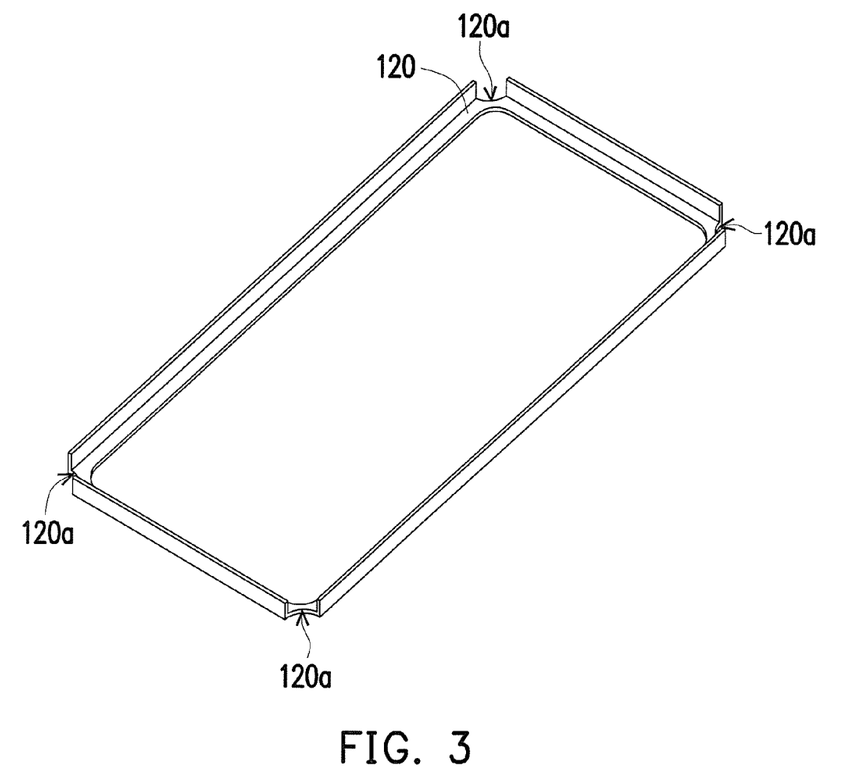
FIG. 3 is a perspective diagram of a frame in FIG. 2.

FIG. 3 is a perspective diagram of a frame in FIG. 2. Referring to FIG. 2 and FIG. 3, the shell structure 100 further includes a frame 120. The frame 120 is wrapped by the casing 110, the casing 110 and the frame 120 have a plurality of buffering spaces S therebetween, and each of the buffering spaces S is aligned to a border of the first side 110a and the second side 110b. In addition, the frame 120 has a plurality of notches 120a, and each of the notches 120a is aligned to the border of the first side 110a and the second side 110b. In the present embodiment, a material of the frame 120 can be a plastic material such as fiber reinforced plastic (FRP) or polymer made of polycarbonate (PC) resin and ABS resin, can be polymer made of PC resin and ABS resin in addition with talc, and can also be a metallic material such as magnesium alloy, in which the invention is not limited thereto.

Under the above-mentioned configuration, the casing 110 is constituted by the elastic material structure 112 and the fiber structure 114; and in addition to an elastic cushioning effect being provided to the casing 110 through the elastic material structure 112, a tenacity is also provided to the casing 110 through the fiber structure 114, so that the casing 110 has both the characteristics of flexibility and tenacity and thus can effectively cushion and disperse an impact force when subjected to an impact. Moreover, the buffering space S between the casing 110 and the frame 120 is aligned to the border of the first side 110a and the second side 110b of the casing 110, and the border is, namely, a corner region of the shell structure 100 which is most liable to be subjected to an impact when the shell structure 100 is dropped. Thus, when the corner region is subjected to an impact, the buffering space S can provide the casing 110 with sufficient degree of elastic deformability so as to absorb the impact force and to reduce the number of bounces after the shell structure 100 is dropped on the ground, thereby preventing other parts of the shell structure 100 from being damaged due to hitting with the ground during bouncing. Moreover, the notches 120a of the frame 120 are aligned to the border of the first side 110a and the second side 110b of the casing 110, and thus when the corner region is subjected to an impact, the frame 120 can be prevented from being damaged due to stress concentration at the premises. As such, the shell structure 100 can achieve a favorable crashworthiness effect without requiring to be configured with a protruding elastic material at the corner region and without requiring to constitute a double-layer structure by overlapping casings at the periphery of the device body, and can thus comply with a design trend of thin and smooth.

Specifically, since the shell structure 100 of the present embodiment, unlike the traditional crashworthiness mobile phone, does not configure the protruding elastic material at the corner region of the casing, a distance between the two first sides 110a, a shown in FIG. 1, is a maximum width of the shell structure 100, and a distance between the two second sides 110b, as shown in FIG. 1, is a maximum length of the shell structure 100, so that the structure at the corner region of the shell structure 100 is relatively smooth.

In the elastic material structure 112 of the present embodiment, a hardness of the outer layer structure 112a is, for example, greater than a hardness of the inner layer structure 112b, so that the outer layer structure 112a which serves as the appearance of the device is less prone to wear. However, the invention is not limited thereto. In other embodiment, the hardness of the outer layer structure 112a can be smaller than or equal to the hardness of the inner layer structure 112b.

Figure 4:
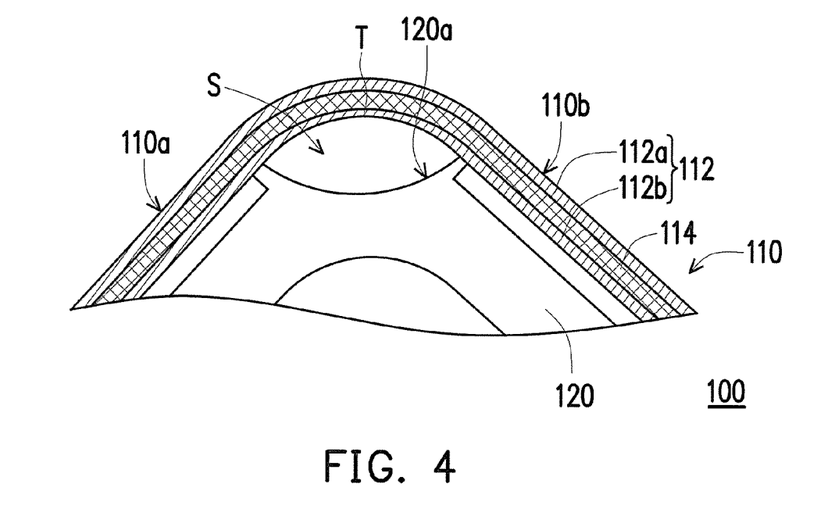
FIG. 4 is a partially enlarged diagram of a shell structure according to another embodiment of the invention.

FIG. 4 is a partially enlarged diagram of a shell structure according to another embodiment of the invention. A difference between the embodiment shown in FIG. 4 and the embodiment shown in FIG. 2 lies in that, a thickness of an inner layer structure 112b' of FIG. 4 at a portion T of the border of the first side 110a and the second side 110b is smaller, such that a thickness of the casing 110 at the border of the first side 110a and the second side 110b is smaller than a thickness of other part of the casing 110, and thus a sufficiently large buffering space S can be provided herein.

Figure 5:
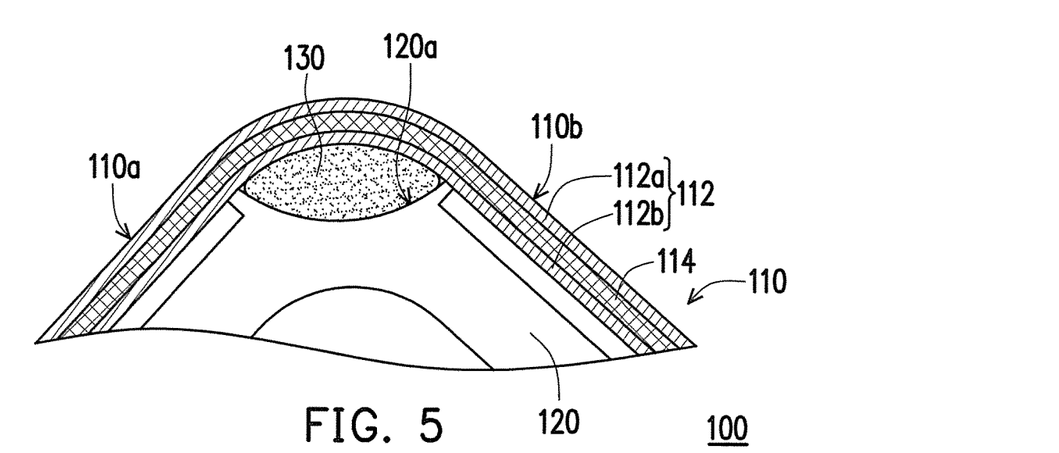
FIG. 5 is a partially enlarged diagram of a shell structure according to another embodiment of the invention.

FIG. 5 is a partially enlarged diagram of a shell structure according to another embodiment of the invention. A difference between the embodiment shown in FIG. 5 and the embodiment shown in FIG. 2 lies in that, the shell structure 100 of FIG. 5 is additionally configured with a buffer structure 130, and the buffer structure 130 is disposed in the buffering space S shown in FIG. 2. The buffer structure 130 is, for example, a mucell/microcellular or the suitable type of porous elastic body for providing further cushioning effect when the corner region of the shell structure 100 is subjected to an impact.

Figure 6:
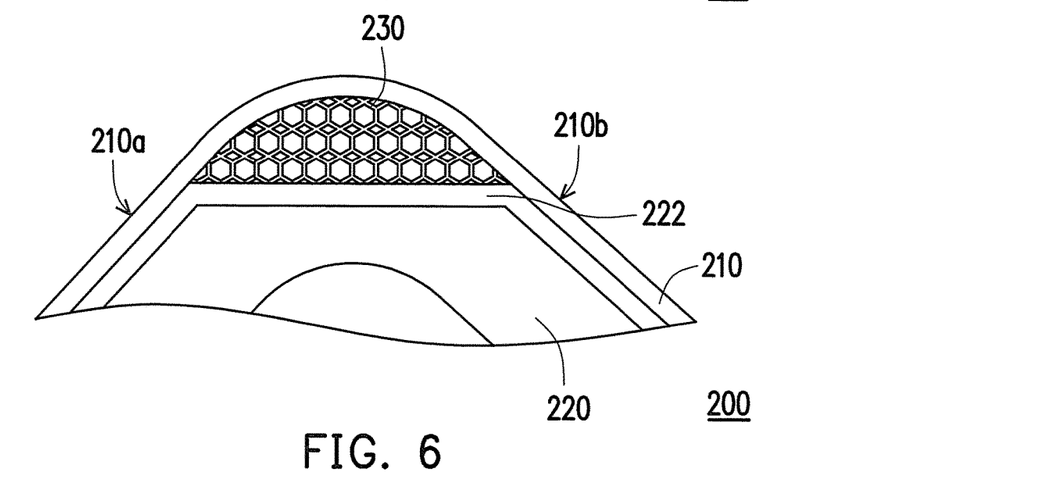
FIG. 6 is a partially enlarged diagram of a shell structure according to another embodiment of the invention.

FIG. 6 is a partially enlarged diagram of a shell structure according to another embodiment of the invention. In a shell structure 200 of FIG. 6, modes of action for a casing 210, a first side 210a, a second side 210b, a frame 220 and a buffer structure 230 are the same as that of the casing 110, the first side 110a, the second side 110b, the frame 120 and the buffer structure 130 of FIG. 2, and thus will not be repeated herein. A difference between the shell structure 200 and the shell structure 100 lies in that, the buffer structure 230 is a honeycomb structure rather than a mucell/microcellular, wherein the buffer structure 230 and the casing 210 can be an integrally formed structure made of same material or a non-integrally formed structure, in which the invention is not limited thereto. In addition, the corner region of the frame 220 has a retaining wall 222 for protecting components within the frame 220. Moreover, the casing 210 is an elastic material structure layer and does not include a fiber structure, but the invention is not limited thereto, such that the casing 210 may also include a fiber structure as shown in the embodiment of FIG. 2.

Figure 7:
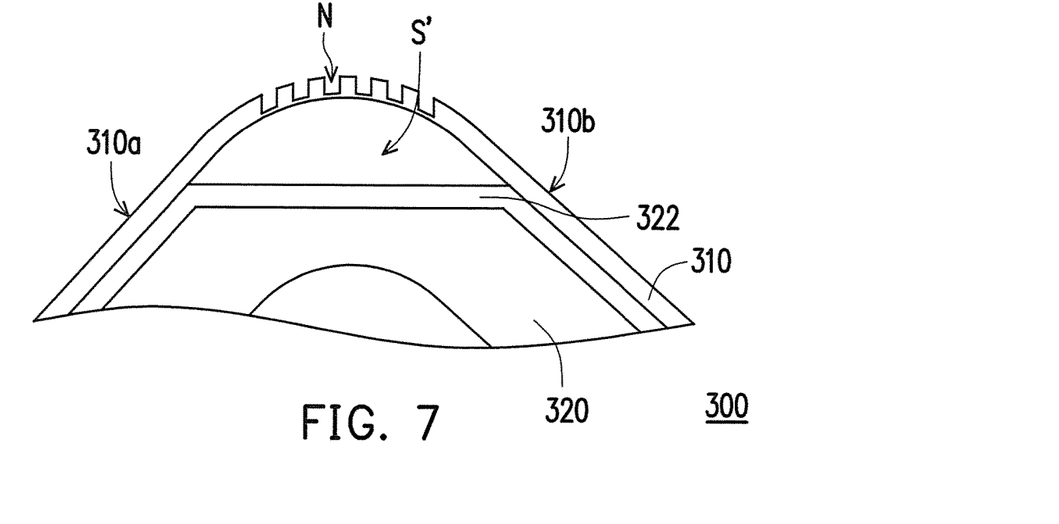
FIG. 7 is a partially enlarged diagram of a shell structure according to another embodiment of the invention.

FIG. 7 is a partially enlarged diagram of a shell structure according to another embodiment of the invention. In a shell structure 300 of FIG. 7, modes of action for a casing 310, a first side 310a, a second side 310b, a frame 320 and a retaining wall 322 are similar to that of the casing 210, the first side 210a, the second side 210b, the frame 220 and the retaining wall 222 of FIG. 6, and thus will not be repeated herein. A difference between the shell structure 300 and the shell structure 200 lies in that, the shell structure 300 does not has a buffer structure in a buffering space S', and the casing 310 has a plurality of nicks N at a border of the first side 310a and the second side 310b. The nicks N can increase an elastic deformability of the casing 310, so as to provide further cushioning effect when the corner region of the shell structure 300 is subjected to an impact.

Figure 8A:
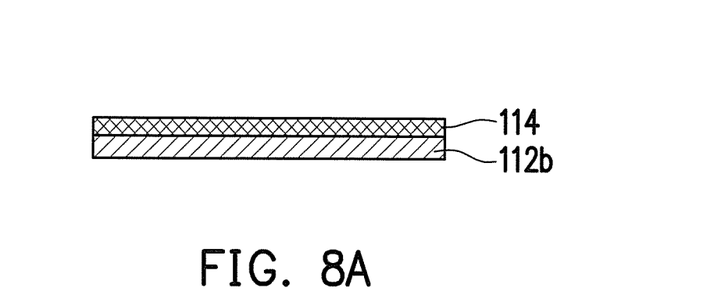
FIG. 8A to FIG. 8D are flow diagrams illustrating a manufacturing method of a shell structure according to an embodiment of the invention.
Figure 8B:
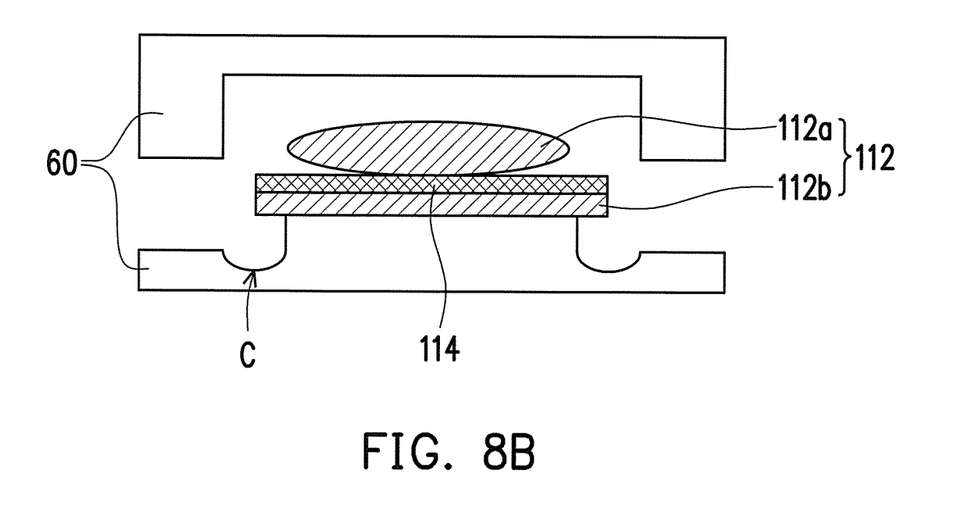
Figure 8C:
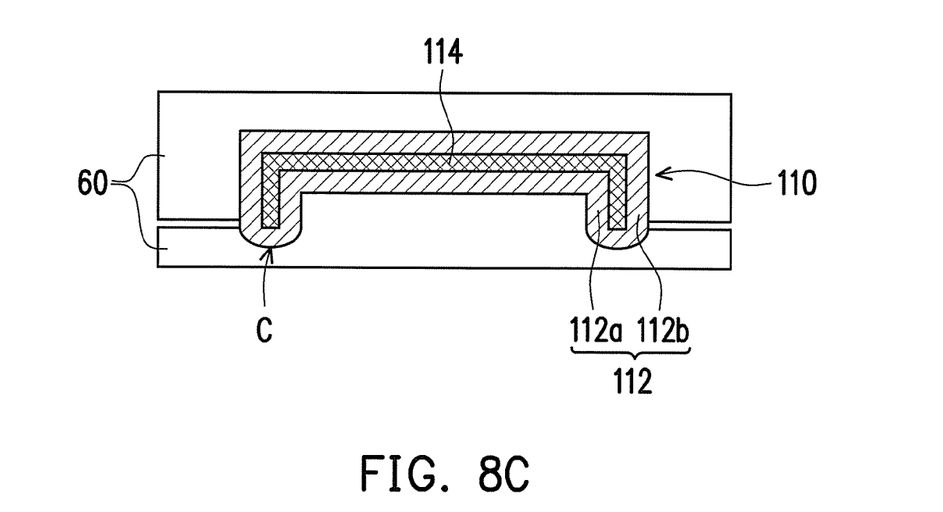
Figure 8D:
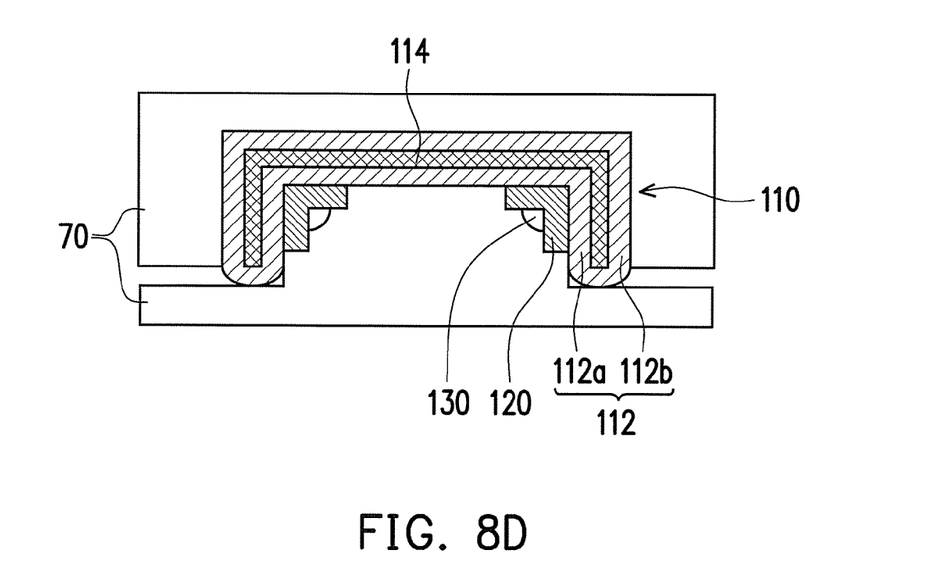

In the following, using the shell structures shown in FIG. 1 through FIG. 5 as examples, a manufacturing method of the shell structure according to an embodiment of the invention is further described. FIG. 8A to FIG. 8D are flow diagrams illustrating a manufacturing method of a shell structure according to an embodiment of the invention. Firstly, as shown in FIG. 8A to FIG. 8B, an elastic material structure 112 and a fiber structure 114 is provided. In this step, for instance, as firstly shown in FIG. 8, an inner layer structure 112b and the fiber structure 114 are provided, wherein the inner layer structure 112b is combined to a side of the fiber structure 114 by means of impregnation or painting; and then, as shown in FIG. 8B, an outer layer structure 112a is provided to another side of the fiber structure 114. Next, as shown in FIG. 8C, the outer layer structure 112a is combined to the another side of the fiber structure 114 by performing a first hot-pressing process through using a first mold 60, and the elastic material structure 112 constituted by the outer layer structure 112a and the inner layer structure 112b are formed with the fiber structure 114 into a casing 110. Then, as shown in FIG. 8D, a frame 120 is provided, and the casing 110 is combined to the frame 120 by performing a second hot-pressing process through using a second mold 70. In addition, in the step shown in FIG. 8D, a buffer structure 130 may further be provided, and the buffer structure 130 can be combined to the frame 120 through the second hot-pressing process.

In other embodiment, the outer layer structure 112a, the inner layer structure 112b and the fiber structure 114 may also be directly provided in the step shown in FIG. 8A, wherein the outer layer structure 112a and the inner layer structure 112b may separately be combined to two opposite sides of the fiber structure 114 by means of impregnation or painting, and then the casing 110 may be formed with the outer layer structure 112a, the inner layer structure 112b and the fiber structure 114 by performing the first hot-pressing process.

In the above-mentioned manufacturing method, when using the first mold 60 to perform the first hot-pressing process, the fiber structure 114 is to be wrapped in a periphery of the casing 110, and the specific approaches are as described below. The first mold 60, as shown in FIG. 8C, has a concave portion C at the periphery of the casing 110, and thus when using the first mold 60 to perform the hot-pressing process, a portion of the elastic material structure 112 will go into the concave portion C to wrap the fiber structure 114 at the periphery of the casing 110. As such, users can be prevented from inadvertently touching the fiber structure 114 and causing a portion of the fiber structure 114 to enter into the human body.

Figure 9A:
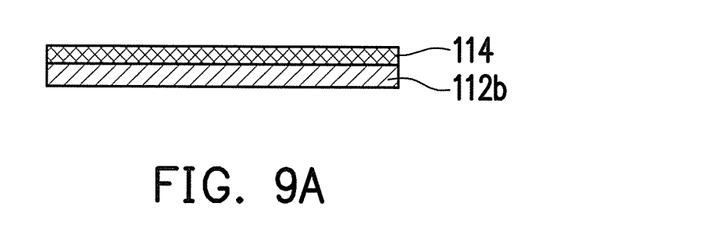
FIG. 9A to FIG. 9D are flow diagrams illustrating a manufacturing method of a shell structure according to another embodiment of the invention.
Figure 9B:
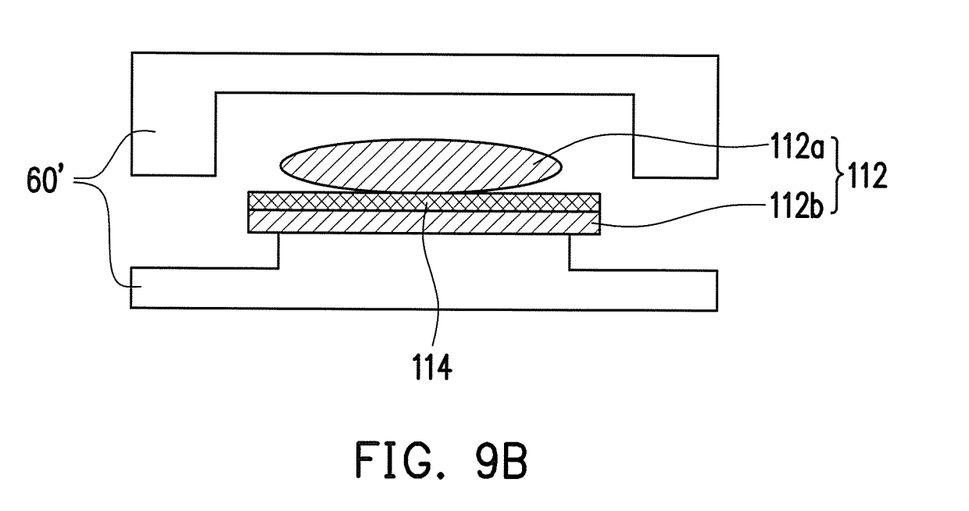
Figure 9C:
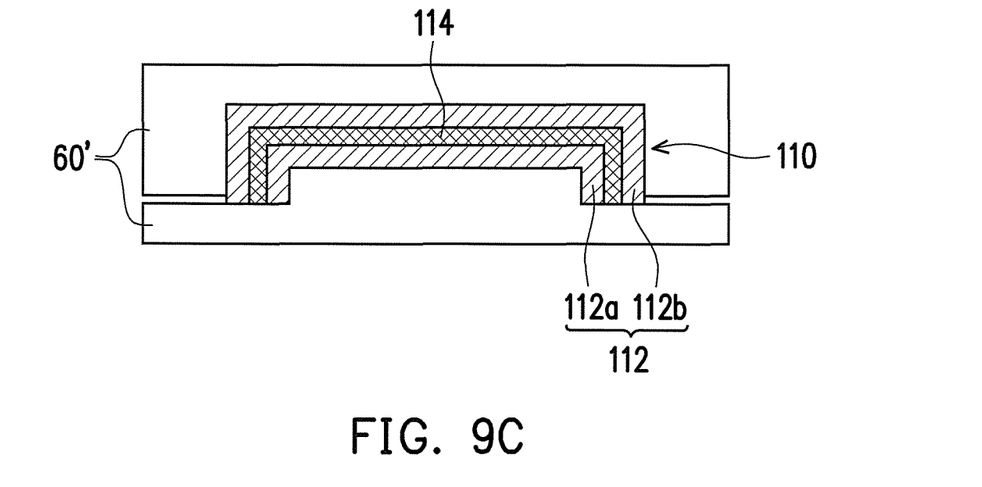
Figure 9D:
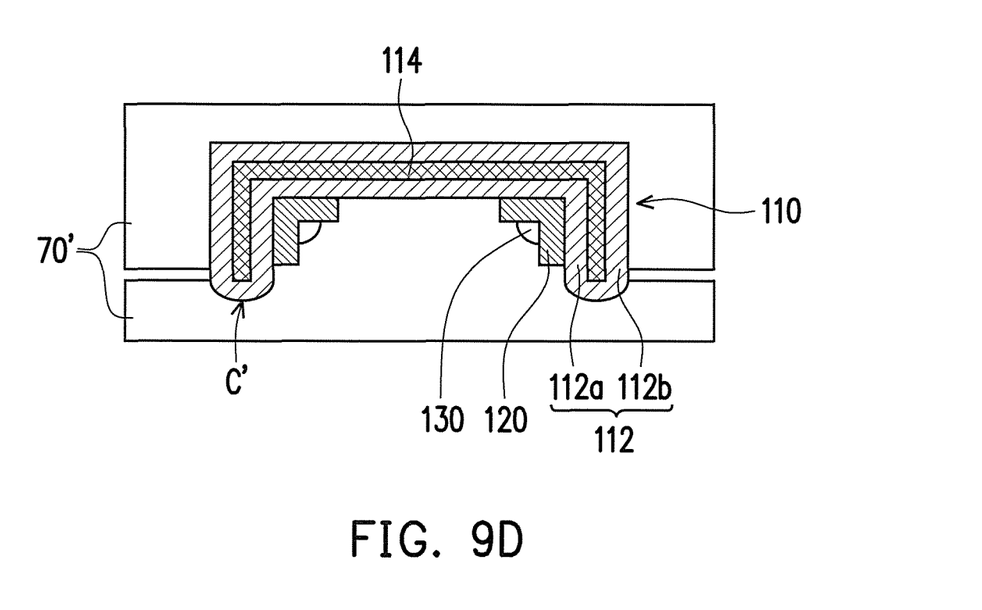

FIG. 9A to FIG. 9D are flow diagrams illustrating a manufacturing method of a shell structure according to another embodiment of the invention. The manufacturing processes shown in FIG. 9A to FIG. 9C are similar to the manufacturing processes shown in FIG. 8A to FIG. 8C, and thus will not be repeated herein, whereby a difference therebetween lies in that a first mold 60' shown in FIG. 9A to FIG. 9C does not has a concave portion C, and thus when using the first mold 60' to perform the first hot-pressing process, the fiber structure 114 is not yet wrapped at the periphery of the casing 110. When using a second mold 70' shown in FIG. 9D to perform the second hot-pressing process, the fiber structure 114 is then being wrapped at the periphery of the casing 110, and the details are as described below. The second mold 70', as shown in FIG. 9D, has a concave portion C' at the periphery of the casing 110, and thus when using the second mold 70' to perform the hot-pressing process, a portion of the buffer structure 130 will go into the concave portion C' to wrap the fiber structure 114 at the periphery of the casing 110. As such, the users can be prevented from inadvertently touching the fiber structure 114 and causing a portion of the fiber structure 114 to enter into the human body.

In summary, in the shell structure of the invention, the casing is constituted of the elastic material structure and the fiber structure; and in addition to the elastic cushioning effect being provided to the casing through the elastic material structure, the tenacity is also provided to the casing through the fiber structure, so that the casing has both the characteristics of flexibility and tenacity and thus can effectively cushion and disperse an impact force when subjected to an impact. Moreover, the buffering space between the casing and the frame is aligned to the border of the two sides of the casing, and the border is, namely, the corner region of the shell structure which is most liable to be subjected to an impact when the shell structure is dropped. Thus, when the corner region is subjected to an impact, the buffering space can provide the casing with sufficient degree of elastic deformability so as to absorb the impact force and to reduce the number of bounces after the shell structure is dropped on the ground, thereby preventing other parts of the shell structure from being damaged due to hitting with the ground during bouncing. Moreover, the notches of the frame are aligned to the border of the first side and the second side of the casing, and thus when the corner region is subjected to an impact, the frame can be prevented from being damaged due to stress concentration at the premises. Furthermore, the buffering space can be further disposed with a buffer structure so as to further increase crashworthiness of the shell structure. As such, the shell structure can achieve a favorable crashworthiness effect without requiring to be configured with a protruding elastic material at the corner region and without requiring to constitute a double-layer structure by overlapping casings at the periphery of the device body, and can thus comply with the design trend of thin and smooth.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A shell structure, comprising:
a casing, comprising an elastic material structure and a fiber structure, wherein the fiber structure is intermixed with the elastic material structure, and the casing has at least two sides adjacent to each other; and
a frame, wrapped by the casing, wherein the casing and the frame have at least one buffering space therebetween, the buffering space is aligned to a border of the two sides.

2. The shell structure as recited claim 1, wherein the fiber structure is a woven fiber layer.

3. The shell structure as recited claim 1, wherein the elastic material structure comprises an outer layer structure and an inner layer structure, and the fiber structure is wrapped between the outer layer structure and the inner layer structure.

4. The shell structure as recited claim 3, wherein a hardness of the outer layer structure is greater than a hardness of the inner layer structure.

5. The shell structure as recited claim 1, wherein the frame has at least one notch, and the notch is aligned to the border of the two sides.

6. The shell structure as recited claim 1, further comprising a buffer structure, wherein the buffer structure is disposed in the buffering space.

7. The shell structure as recited claim 6, wherein the buffer structure is a porous elastic body.

8. The shell structure as recited claim 6, wherein the buffer structure is a honeycomb structure.

9. The shell structure as recited claim 1, wherein a thickness of the casing at the border of the two sides is smaller than a thickness of other part of the casing.

10. The shell structure as recited claim 1, wherein the number of the at least two sides is four, the sides are sequentially connected and comprises two first sides opposite to each other and two second sides opposite to each other, a distance between the two first sides is a maximum width of the shell structure, and a distance between the two second sides is a maximum length of the shell structure.

11. The shell structure as recited claim 1, wherein the frame is encircled by the casing.

12. The shell structure as recited claim 1, the fiber structure is wrapped in a periphery of the casing.

13. A shell structure, comprising:
 a casing, comprising an elastic material structure, wherein the casing has at least two sides adjacent to each other; and
 a frame, wrapped by the casing, wherein the casing and the frame have at least one buffering space therebetween, the frame has at least one notch, and the buffering space and the notch are aligned to a border of the two sides.

14. The shell structure as recited in claim 13, wherein the casing further comprises a fiber structure, and the fiber structure is intermixed with the elastic material structure.

15. The shell structure as recited in claim 14, wherein the fiber structure is a woven fiber layer.

16. The shell structure as recited in claim 14, wherein the elastic material structure comprises an outer layer structure and an inner layer structure, and the fiber structure is wrapped between the outer layer structure and the inner layer structure.

17. The shell structure as recited in claim 16, wherein a hardness of the outer layer structure is greater than a hardness of the inner layer structure.

18. The shell structure as recited in claim 13, further comprising a buffer structure, wherein the buffer structure is disposed in the buffering space.

19. The shell structure as recited in claim 18, wherein the buffer structure is a porous elastic body.

20. The shell structure as recited in claim 18, wherein the buffer structure is a honeycomb structure.

21. The shell structure as recited in claim 13, wherein a thickness of the casing at the border of the two sides is smaller than a thickness of other part of the casing.

22. The shell structure as recited in claim 13, wherein the number of the at least two sides is four, the sides are sequentially connected and comprise two first sides opposite to each other and two second sides opposite to each other, a distance between the two first sides is maximum width of the shell structure, and a distance between the two second sides is a maximum length of the shell structure.

23. The shell structure as recited in claim 13, wherein the casing has a plurality of nicks at the border of the two sides.

24. A manufacturing method of a shell structure, comprising:
 providing an elastic material structure and a fiber structure, and foil ling a casing with the elastic material structure and the fiber structure by performing a first hot-pressing process;
 providing a frame, and combining the casing to the frame by performing a second hot-pressing process; and
 when performing the first hot-pressing process or the second hot-pressing process, enabling the fiber structure to be wrapped at a periphery of the casing.

25. The manufacturing method of the shell structure as recited in claim 24, wherein the step of forming the casing with the elastic material structure and the fiber structure by performing the first hot-pressing process comprises:
 providing an inner layer structure and a fiber structure, wherein the inner layer structure is combined to a side of the fiber structure; and
 providing an outer layer structure at another side of the fiber structure, and combining the outer layer structure to the another side of the fiber structure and forming the casing with the outer layer structure, the inner layer structure and the fiber structure by performing the first hot-pressing process, wherein the elastic material structure comprises the outer layer structure and the inner layer structure.

26. The manufacturing method of the shell structure as recited in claim 24, wherein the step of forming the casing with the elastic material structure and the fiber structure by performing the first hot-pressing process comprises:
 providing an outer layer structure, an inner layer structure and a fiber structure, wherein the outer layer structure and inner layer structure are respectively combined to two opposite sides of the fiber structure; and
 forming the casing with the outer layer structure, the inner layer structure and the fiber structure by performing the first hot-pressing process.

27. The manufacturing method of the shell structure as recited in claim 24, wherein the step of forming the casing with the elastic material structure and the fiber structure comprises:
 performing the first hot-pressing process with a first mold.

28. The manufacturing method of the shell structure as recited in claim 27, wherein the first mold has a concave portion at the periphery of the casing, and the step of enabling the fiber structure to be wrapped at the periphery of the casing comprises:
 enabling a portion of the elastic material structure to go into the concave portion so as to wrap the fiber structure at the periphery of the casing.

29. The manufacturing method of the shell structure as recited in claim 24, wherein the step of combining the casing to the frame comprises:
 performing the second hot-pressing process with a second mold.

30. The manufacturing method of the shell structure as recited in claim 29, wherein the second mold has a concave portion at the periphery of the casing, and the step of enabling the fiber structure to be wrapped by the elastic material structure at the periphery of the casing comprises:
 providing a buffer structure, and combining the buffer structure to the frame by performing the second hot-pressing process; and
 enabling a portion of the buffer structure to go into the concave portion so as to wrap the fiber structure at the periphery of the casing.

* * * * *